(12) United States Patent
Goldthorp et al.

(10) Patent No.: US 6,349,267 B1
(45) Date of Patent: Feb. 19, 2002

(54) RISE AND FALL TIME MEASUREMENT CIRCUIT

(75) Inventors: David C. Goldthorp, Reiffton; Thomas Dang, Laureldale; Glen A. Johnson, Reading, all of PA (US)

(73) Assignee: Agere Systems Inc., Miami Lakes, FL (US)

( * ) Notice: Subject to any disclaimer, the term of this patent is extended or adjusted under 35 U.S.C. 154(b) by 0 days.

(21) Appl. No.: 09/151,659

(22) Filed: Sep. 11, 1998

(51) Int. Cl.[7] .............................................. G01R 13/00
(52) U.S. Cl. ........................... 702/69; 202/79; 202/66; 345/940; 716/6
(58) Field of Search .............................. 702/69, 66, 79, 702/108, 179; 345/940; 703/19; 716/6, 10; 714/745

(56) References Cited

U.S. PATENT DOCUMENTS

| | | | | |
|---|---|---|---|---|
| 4,855,968 A | * | 8/1989 | Shank | 368/115 |
| 5,274,568 A | | 12/1993 | Blinne et al. | 716/6 |
| 5,296,869 A | * | 3/1994 | Jonker et al. | 345/940 |
| 5,754,439 A | * | 5/1998 | Holcomb et al. | 702/66 |
| 5,761,081 A | * | 6/1998 | Tomita et al. | 702/66 |
| 6,006,350 A | * | 12/1999 | Tsujii | 714/738 |

* cited by examiner

*Primary Examiner*—Kamini Shah
(74) *Attorney, Agent, or Firm*—Dickstein Shapiro Morin & Oshinsky LLP

(57) ABSTRACT

The invention relates to a circuit for testing digital logic circuitry to determine the rise and fall time associated with a particular circuit. The circuit is tested by sending a test signal to the input of the circuit and measuring the area under a waveform taken at the output of the circuit.

69 Claims, 4 Drawing Sheets

RISE AND FALL TIME MEASUREMENT CIRCUIT

BACKGROUND OF THE INVENTION

1. Field of the Invention

This invention relates generally to a circuit for measuring the rise and fall time of a digital electrical signal without using an oscilloscope.

2. Description of the Related Art

Many computers and other devices on the market today include digital logic circuitry. This circuitry allows the computer or device to perform functions specified by the user. Digital logic circuitry operates using only two different voltage signals, representing a logic "zero" and "one." As such, digital logic circuits are often switching between an "on" state (e.g. a logic "1") and an "off" state (e.g. a logic "0"). The rate at which the logic circuitry can perform functions is partially dependent on the rate at which the circuitry can switch between logic states.

Digital logic circuits do not switch between a "0" to a "1" state immediately. There is an inherent delay associated with the switching process which includes rise and fall time. Rise time is the time it tales a digital logic circuit to transition from low to high logic level (e.g. "0" to "1"), and fall time is the time it takes to transition from a high to a low logic level (e.g. "1" to "0"). Each different digital logic circuit has a different associated rise and fall time. It is important for the fabricator of a device including digital logic to be able to measure these rise and fall times, so that he may know exactly how fast the device will operate.

Traditionally, when one wanted to determine the characteristics of a particular circuit, the circuit would be connected to an oscilloscope and its waveform shape would be observed. By this observation, the approximate rise and fall time of the circuit can be determined. As noted above, this information is useful in calculating the speed associated with a particular circuit.

However, oscilloscopes are costly devices which often include complex circuitry. Hence, there is currently a need for a small simple device which can measure the rise and fall times of a digital signal produced by an electrical circuit.

SUMMARY OF THE INVENTION

The present invention is designed to provide a simple testing circuit capable of determining the rise and/or fall time of an output signal of a digital logic circuit. The digital logic circuit is supplied with a test signal from the testing circuit. The output signal from the digital logic circuit is compared with two threshold values for each of a rising and/or falling edge of the output signal. Based on when the output signal crosses the threshold values, a first set of waveforms are created for each of the rising and/or falling edge of the output signal which are then input to a digital logic array. The logic array produces a second set of waveforms indicative of the rise and/or fall time of the digital logic circuit. The second set of waveforms are then respectively integrated to determine their average value. This average value is then used in a calculation to determine the rise and/or fall time of the digital logic circuit. The testing circuit which accomplishes this measurement is simple and inexpensive. Hence, by using the testing circuit of the present invention, one can measure the rise and fall time of digital logic circuit without the need for expensive equipment, such as an oscilloscope.

The components of an electrical circuit of the invention for measuring rise and fall time have their own associated rise and fall time, which may affect the accuracy of the device. However, such problems are avoided in the invention because the same measurement circuitry is used for all measurements. Therefore, measurement circuit errors are common to all waveforms, and are mathematically canceled out in subsequent calculations.

The above and other advantages and features of the present invention will be better understood from the following detailed description of the preferred embodiments of the invention which is provided in connection with the accompanying drawings.

DETAILED DESCRIPTION OF THE PREFERRED EMBODIMENTS

Figure 1:
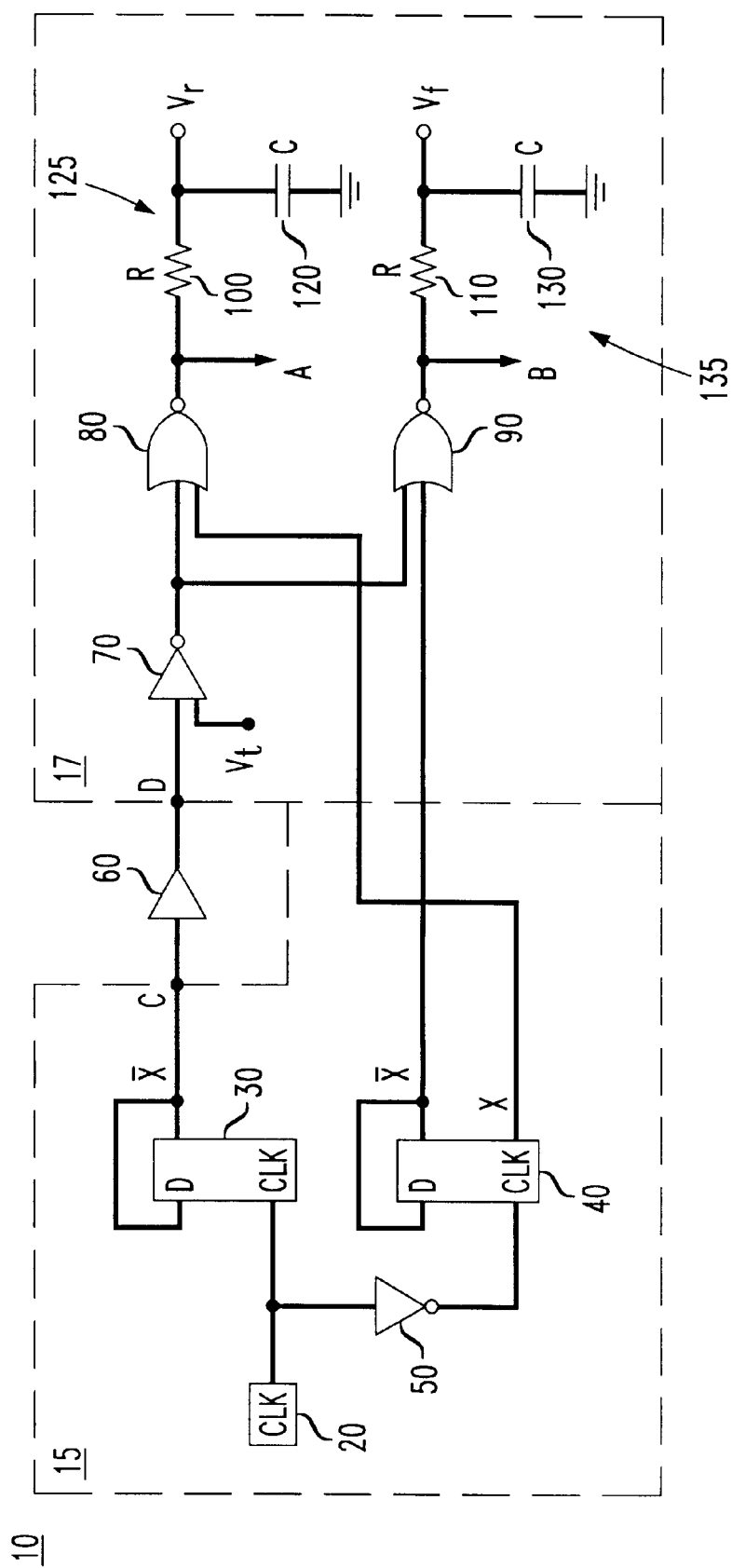
FIG. 1 illustrates the circuit of the preferred embodiment of the present invention.

FIG. 1 shows the circuit 10 of the preferred embodiment of the present invention. The circuit 10 includes a clock generator 20 for generating a square wave clocking signal for flip-flops 30 and 40. Flip-flop 30 is clocked at the same phase as the clock generator 20, but flip-flop 40 is clocked 180 degrees out of phase with the clock generator by inverter 50 to produce an output at the flip-flop 40 which is shifted 90 degrees from the output of flip-flop 30. The output of flip-flop 30 is connected to a tested circuit 60. This tested circuit 60 can be any type of digital logic circuit which switches between "on" (e.g. logic "0") and "off" (e.g. logic "1") states. The output of the tested circuit 60 is connected to the input of a comparator 70. The comparator 70 has another input, Vt, which is a threshold voltage input port. The input signal supplied to this port will vary as discussed in detail below. The output of the comparator 70 is inverted and supplied to one of the inputs of a logic array in the form of two different NOR gates 80 and 90. The other inputs of NOR gates 80, 90 are supplied with clocking signals x and $\bar{x}$, created by flip-flop 40. The output of each NOR gate 80 and 90 is connected to a respective integrator circuit 125, 135 formed by resistors 100, 110 and capacitors 120, 130. At the output of each NOR gate 80, 90, there are provided output nodes A and B. These nodes are used to measure the maximum and minimum voltages, and the period of the waveform which is present at this point. These values will be used, as explained below, to calculate the rise and fall times of the tested circuit 60. At the node between each resistor and capacitor there are provided outputs ports Vr and Vf. Vr is an output port which produces an average voltage value indicative of the rise time of the tested circuit 60, and Vf is an output port which produces an average voltage value indicative of fall time of the tested circuit 60. The operation of the FIG. 1 circuit will next be explained with further reference to FIG. 2.

Figure 2:
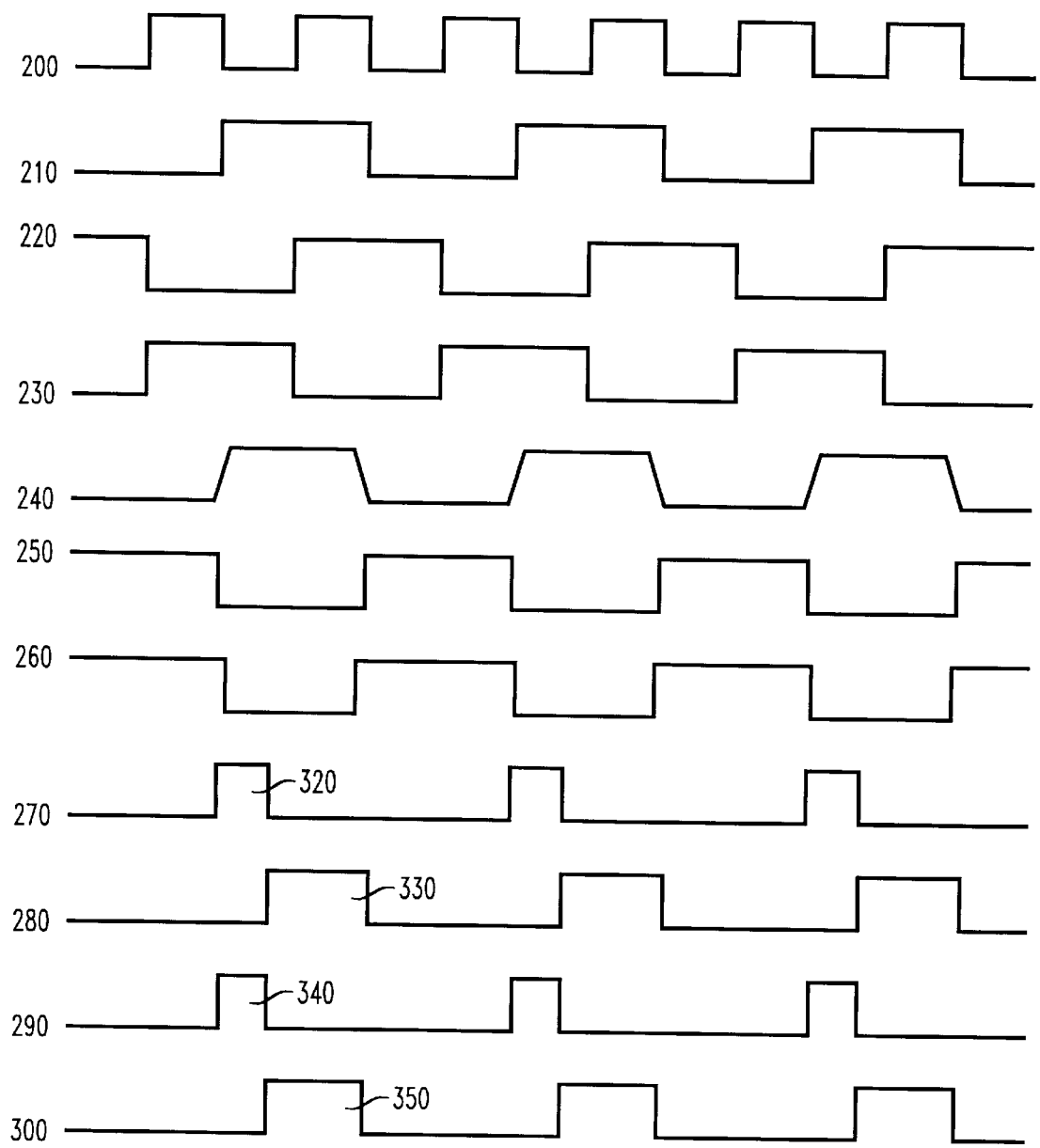
FIG. 2 illustrates a timing diagram showing the waveforms created by the circuit of the preferred embodiment.

FIG. 2 shows a timing diagram with timing signals taken at different portions of the circuit 10. The clock generator 20 creates a substantially square waveform with a 50% duty cycle as shown by waveform 200. This square wave is fed to the flip-flop 30 where it is transformed into a wave with half the frequency, depicted as waveform 210. This signal 210 is a test signal which is fed to the input of the tested circuit 60. The clock signal going to the flip-flop 40 is inverted by inverter 50 and then fed to the clock input of the flip-flop 40. This produces a waveform 230 at the x̄ output, with the same frequency as waveform 210, but which is 90 degrees out of phase (lagging). The x output of flip-flop 40 produces a waveform 220 which has the same frequency as waveform 210, but which is 90 degrees out of phase (leading). These waveforms x and x̄ are used as clock signals for the NOR gates 80 and 90 as explained below.

When the waveform 210 is input to the tested circuit 60, the output of the test circuit will produce a waveform such as 240, where the wave exhibits a noticeable rise and fall time. This output waveform 240 is then compared to a threshold voltage value, Vt, in the comparator 70. The present inventors have discovered that by measuring the output waveform 240 at points which are ten percent (10%) and ninety percent (90%) of the maximum voltage of the output signal 240, the rise and fall time of the tested circuit 60 can be easily determined. Although the ten percent and ninety percent points are thought to produce the best results, other points, preferably equally spaced from the highest and lowest values of the waveform 240, may also be used(e.g. 15% and 85% of the maximum voltage of the output signal 240).

The comparator 70 compares the output waveform 240, to the threshold voltage, Vt, and provides a logic "0" or "1" output accordingly. If the voltage level of the output waveform 240 is below the specified value Vt, the comparator will output a logic "0". If the voltage output of the output waveform 240 is above the specified value Vt, the comparator will output a logic "1". In the circuit of the present invention two different values are used for Vt to obtain two different sets of output values. These values can be set by the user of the test circuit manually by altering the DC voltage applied to the Vt port of the comparator 70, or can be changed automatically. Vt is first set to a value which is ten percent of the maximum voltage of the output waveform 240. Then, Vt is set to a value which is ninety percent of the maximum voltage of output waveform 240. In Transistor-Transistor Logic (TTL) applications, this maximum voltage will be approximately 5 volts, for Complimentary Metal Oxide Semiconductor (CMOS) applications the maximum voltage may be lower, but the invention is not restricted to any particular voltage value. For purposes of this discussion it will be assumed that the maximum voltage of the output waveform 240 is 5 volts.

The output waveform 240 is first compared with a 0.5 volt (10% of 5 volts) threshold voltage in the comparator 70, and a first comparator output waveform 250 is generated. By close examination of this waveform it will be noted that it switches logic levels (i.e. from "0" to "1" or "1" to "0") at each point where the output waveform 240 goes above or below ten percent of the maximum value. This first comparator output waveform 250 will be fed to the NOR gates 80 and 90, as explained in detail below. After the first comparator output waveform 250 is obtained and sent to the NOR gates, the threshold voltage Vt on the comparator 70 is switched to a different value to obtain a second comparator output waveform. Now, Vt is set to a value ninety percent of the maximum voltage of the output waveform 240, or approximately 4.5 volts. The resulting second comparator output waveform 260 switches logic levels every time the output waveform 240 goes above or below ninety percent of its maximum value. The value Vt is then used to a ten percent voltage level after the ninety percent value is taken on the falling edge of waveform 240. The ten percent output waveform 250 and the ninety percent output waveform 260 are used to determine the rise and fall time of the tested circuit 60, as explained below.

The comparator output waveforms 250 and 260 are fed to the NOR gates 80 and 90, one at a time. The NOR gates are clocked by signals x and x̄, in order to isolate the important portions of the waveforms 250 and 260. When determining rise time, only the trailing edge of the pulses are important, therefore, the timing signal x is set so that only the trailing edge portion of the pulses of waveforms 250 and 260 are passed through NOR gate 80 to the integrator circuit 125. Conversely, when determining fall time, only the leading edges of the pulses are important, so the timing signal x̄ is set so that only leading edge portion of the pulses of waveforms 250 and 260 are passed through NOR gate 90 to the integrator circuit 135. Therefore, NOR gate 80 separates out the portion of the waveforms 250, 260 indicative of the rise time of the tested circuit 60, and NOR gate 90 separates out the portion of the waveforms 250, 260 indicative of the fall time of the tested circuit 60. Waveforms 270 and 280 are the signals which appear at the outputs of the NOR gates 80, 90, respectively, when the ten percent waveform 250 is used as the input waveform to the NOR gates 80, 90. Waveforms 290 and 300 are the output waves when the ninety percent waveform 260 is used as the input to the NOR gates 80, 90. The area under the pulses 320, 330, 340, 350 of these respective waveforms(270, 280, 290, 300) is then used to determine the rise and fall times as explained below.

The pulses 320, 330, 340, and 350 in the four waveforms 270, 280, 290, and 300, are signals representative of the rise and fall times of the tested circuit 60. The pulses 320, 340 in waveforms 270 and 290 represent rise time, and the pulses 330, 350 in waveforms 280 and 300 represent fall time. The actual rise and fall time is calculated by determining the area under these pulses. To determine this area, each waveform is integrated by the integrator circuits 125, 135, respectively connected to the outputs of NOR gates 80, 90. Resistor 100 and capacitor 120 comprise the integrator circuit 125 for NOR gate 80, and resistor 110 and capacitor 130 comprise the integrator circuit 135 for NOR gate 90. At the node between each resistor and capacitor an output voltage is taken. This output voltage is a voltage value representative of the average voltage under the pulses. Resistor 100 and capacitor 120 integrate the pulses 320, 340 of the rise time waveforms 270 and 290, and provide output voltages $Vr_1$ and $Vr_2$, respectively. Resistor 110 and capacitor 130 integrate the pulses 330, 350 of the fall time waveforms 280 and 300 and provide output voltages $Vf_1$ and $Vf_2$, respectively. These values $Vr_1$, $Vr_2$ and $Vf_1$, $Vf_2$ are then used to calculate the actual rise and fall time using the following equations:

$$t_{RISE}=T_{output}[(Vr_1-Vr_2)/(V_{HIGH}-V_{LOW})] \quad (1)$$

where $T_{output}$ is the period of the output wave 240, $Vr_1$ is the voltage Vr of the pulse from the 10% waveform 270, $Vr_2$ is the voltage Vr of the pulse from the 90% waveform 290, $V_{HIGH}$ is the maximum voltage of the waveform 280 or 290 (e.g., 5 V), and $V_{LOW}$ is the minimum voltage of the waveform 280 or 290 (e.g. 0 V), and $$t_{FALL}=T_{output}[(Vf_1-Vf_2)/(V_{HIGH}-V_{LOW})] \quad (2)$$

where $T_{output}$ is the period of the output wave 240, $Vf_1$ is the voltage Vf of the pulse from the 10% waveform 280, $Vf_2$ is the voltage Vf of the pulse from the 90% waveform 300, $V_{HIGH}$ is the maximum voltage of the waveform 280 or 300 (e.g., 5 V), and $V_{LOW}$ is the minimum voltage of the waveform 280 or 300 (e.g. 0 V).

Although the NOR gates 80, 90 and the comparator 70 have their own associated rise and fall times, the accuracy of the circuit 10 remains unaffected. This is because it is the area under the waveforms that is measured to determine the voltage values $Vr_1$, $Vr_2$, $Vf_1$, and $Vf_2$. As long as the delays and rise and/or fall time of each device (i.e. comparator 70 and NOR gates 80,90) remains constant for all measurements, the area under pulses 320–350 of waveforms 270–300 contain the same error terms, which are canceled by equations (1) and (2). Hence, the circuit 10 operates to give an accurate indication of the rise and fall time of the tested circuit 60, even though errors are introduced by the other circuit elements.

Figure 3:
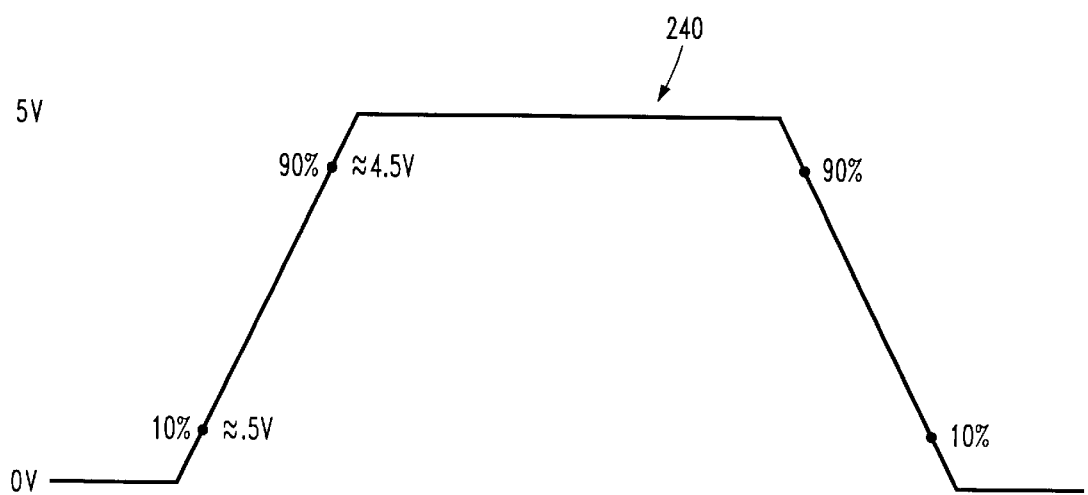
FIG. 3 illustrates the ten percent and ninety points of the waveform 240.

FIG. 3 shows a portion of the waveform 240 at the output of the tested circuit 60 in detail. For purposes of explanation, the maximum and minimum voltage levels have been selected as 0 volts and 5 volts, however any minimum and maximum levels can be utilized with the present invention. The output waveform 240 is measured at two distinct points, the ten percent point (approximately 0.5 volts in TTL applications) and the ninety percent point (approximately 4.5 volts in TTL applications). These points were chosen by the present inventors because they provide an excellent indication of the switching speed of the tested circuit 60, however, as noted earlier, other spaced points on the rising and falling edges of the waveform 240 can also be used(e.g. 15% and 85%). For the best results, the measuring points should be chosen so as to be an equal amount above or below the minimum and maximum logic levels, respectively. In other words, ten percent and ninety percent measuring points provide values which are above and below the minima and maxima by 0.5 volts, fifteen percent and eighty-five percent provide a 0.75 volt differential, and so on.

Testing circuit 10 may be fabricated on a testing board and used in laboratories to test circuits, such as tested circuit 60. Alternately, the entire testing circuit 10 can be formed as a single integrated circuit (IC) chip (shown in dashed lines in FIG. 1), wherein nodes C and D would comprise output and input pins of the chip. Further, the signal generating circuitry 15 (i.e. clock 20, flip-flops 30, 40, and inverter 50) may be provided off-chip, so that only the measuring circuitry 17 (i.e. comparator 70, NOR gates 80,90, and integrators 125, 135) is provided on the IC chip(also shown in dotted lines in FIG. 1). As an additional modification, clock 20 may be provided off-chip, with the remaining circuit elements (i.e. flip-flops 30, 40, inverter 50, comparator 70, NOR gates 80,90, and integrators 125, 135) being provided on the IC chip. Testing circuit 10 may also be included in a device such as a digital voltmeter (in either lumped element or IC chip form), which includes a processor and an associated program for calculating rise and fall time from the measured values $Vr_1$, $Vr_2$, $Vf_1$, and $Vf_2$, and which displays the rise and fall times of tested circuits 60. The circuit 10 may also be fabricated in its own hand-held unit which includes a processor and program for calculating rise and fall times based on the measured $Vr_1$, $Vr_2$, $Vf_1$, and $Vf_2$ values.

Figure 4:
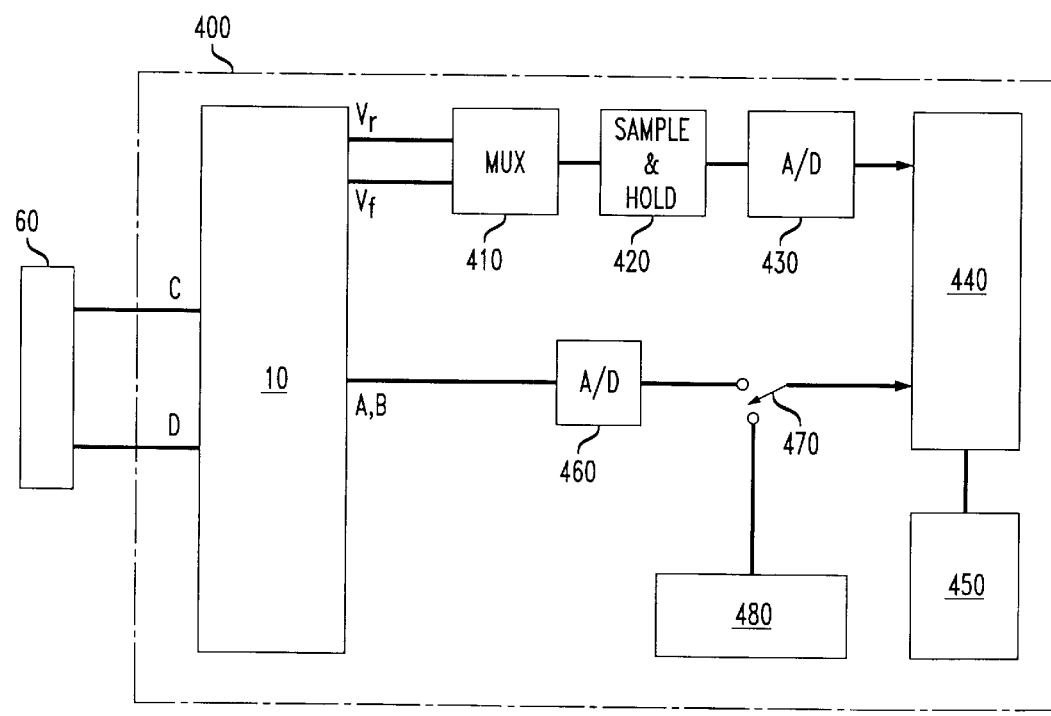
FIG. 4 illustrates a measuring device including the circuit of the preferred embodiment of the present invention; and, FIG. 5 illustrates a program for carrying out the functions of the measuring device of FIG. 4.

FIG. 4 shows a measuring device 400 which incorporates the testing circuit 10. Ideally, this measuring device 400 will be hand-held. The measuring device has test nodes C, D which connect to the input and the output of the tested circuit 60. These test nodes may be in the form of calipers (not shown) which provide a mechanism for transmitting and receiving a test signal to the tested circuit 60. Using the above example, the signal transmitted would be a signal such as waveform 210, and the received signal would be a signal such as waveform 240. The received signal 240 is then measured, as explained above, by the circuit 10. The circuit 10 produces outputs $Vr_1$, $Vr_1$, $Vf_1$, and $Vf_2$ at the Vr and Vf outputs shown in FIG. 4. Each of these four voltage values is fed to a sample and hold circuit 420, one at a time, by a multiplexer 410. The sample and hold circuit 420 samples each analog voltage value (i.e. $Vr_1$, $Vr_2$, $Vf_1$, and $Vf_2$), and transfers it to a first analog to digital (A/D) converter 430. The A/D converter 430 transforms the analog voltage values into digital logic signals that can be utilized by the microprocessor 440 of the measuring device 400. The microprocessor 440 uses the digital voltage values to calculate the rise and fall times through use of the equations (1) and (2) described above. Once the rise and fall times have been calculated, the microprocessor outputs the values to a display 450.

The measuring device 400 also includes a second A/D converter 460. This converter is used to measure the values $V_{HIGH}$, $V_{LOW}$, and $T_{output}$, which are used in the calculation equations (1) and (2). These values are measured at the points A and B shown in FIG. 1. When rise time is being calculated, A is the measuring point, and when fall time is being calculated, B is the measuring point. These values can alternatively be entered by a user through a keypad input 480. The switch 470 allows the user of the measuring device to switch between a manual and an automatic input of the values $V_{HIGH}$, $V_{LOW}$, and $T_{output}$.

Figure 5:
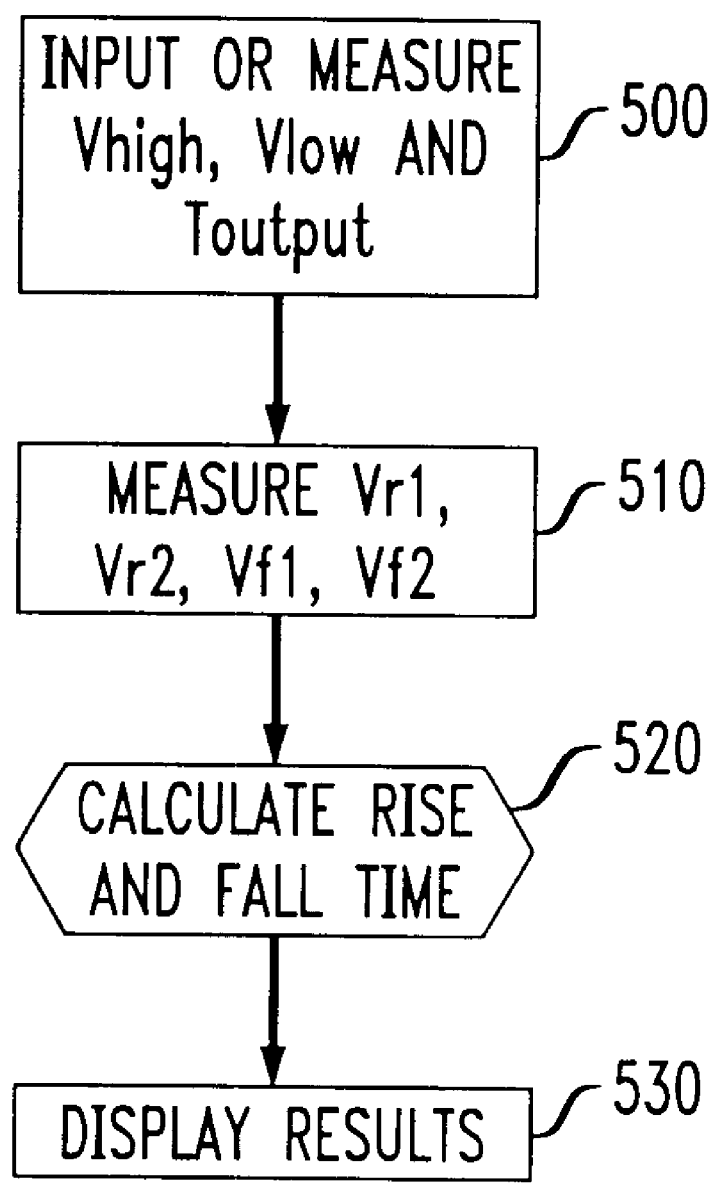

The program which the microprocessor 440 employs to calculate rise and fall time is shown in FIG. 5. At step 500 the voltage values $V_{HIGH}$ and $V_{LOW}$, and the period value $T_{output}$, are either measured or input by the user. Next, at step 510, the rise and fall average voltages ($Vr_1$, $Vr_2$, $Vf_1$, and $Vf_2$) are measured by the microprocessor 440. These values are input into the rise and fall time equations (1) and (2), and the rise and fall times are calculated at step 520. Finally, at step 530, the rise and fall times are displayed on the display 450 of the measuring unit 400.

Although the present invention has been described for use in testing digital logic circuits, it can be used to test the rise and fall time of any device, including an electronic component which has an output which switches. Representative examples include solid state devices, integrated circuits, microprocessors, semiconductor devices, and memory circuits. In addition, although the invention has been described with reference to measuring the rise and fall times of the output signal from a tested circuit 60, the present invention could also be used to determine either the rise or the fall time of a tested circuit.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. An apparatus for determining a switching transition time of a switching device, said apparatus comprising:
    a first signal path for connection to an input of a switching device;

a second signal path for connection to an output of said switching device;

a signal generator for providing a switching signal to said first signal path, said switching signal being capable of causing said switching device to switch from a first state to a second state;

a circuit connected to said second signal path for receiving an output signal from said switching device when it switches from said first state to said second state in response to said switching signal, said circuit comparing the voltage at two points on a portion of said output signal representing a transition of said switching device from said first state to said second state, and providing therefrom a representation of a time of transition of said switching device from said first state to said second state.

2. The apparatus of claim 1, wherein the circuit provides a representation of the rise time of the switching device.

3. The apparatus of claim 1, wherein the circuit provides a representation of the fall time of the switching device.

4. The apparatus of claim 1, wherein the circuit provides a representation of the rise and fall time of the switching device.

5. The apparatus of claim 1, wherein the circuit comprises a comparator for collecting voltage samples from said two points.

6. The apparatus of claim 5, wherein the circuit provides a representation of the rise time of the switching device.

7. The apparatus of claim 5, wherein the circuit provides a representation of the fall time of the switching device.

8. The apparatus of claim 5, wherein the circuit provides a representation of the rise and fall time of the switching device.

9. The apparatus of claim 6, wherein a threshold voltage of the comparator is varied to produce at least two rise time signals.

10. The apparatus of claim 7, wherein a threshold voltage of the comparator is varied to produce at least two fall time signals.

11. The apparatus of claim 8, wherein a threshold voltage of the comparator is varied to produce at least two rise time and at least two fall time signals.

12. The apparatus of claim 9, wherein the circuit further comprises a digital logic gate with an input for receiving said at least two rise time signals.

13. The apparatus of claim 10, wherein the circuit further comprises a digital logic gate with an input for receiving said at least two fall time signals.

14. The apparatus of claim 11, wherein the circuit further comprises two digital logic gates, one with an input for receiving said at least two rise time signals, and another with an input for receiving said at least two fall time signals.

15. The apparatus of claim 12, wherein the digital logic gate is a NOR gate.

16. The apparatus of claim 13, wherein the digital logic gate is a NOR gate.

17. The apparatus of claim 14, wherein the digital logic gates are NOR gates.

18. The apparatus of claim 9, further comprising a time calculating circuit for receiving said at least two rise time signals and calculating the rise time of the output signal based on said at least two rise time signals.

19. The apparatus of claim 10, further comprising a time calculating circuit for receiving said at least two fall time signals and calculating the fall time of the output signal based on said at least two fall time signals.

20. The apparatus of claim 11, further comprising a time calculating circuit for receiving said at least two rise time signals and said at least two fall time signals and calculating the rise and fall time of the output signal based on said rise and fall time signals.

21. The apparatus of claim 18, wherein the time calculating circuit comprises a digital processor.

22. The apparatus of claim 19, wherein the time calculating circuit comprises a digital processor.

23. The apparatus of claim 20, wherein the time calculating circuit comprises a digital processor.

24. The apparatus of claim 18, wherein the time calculating circuit and the circuit are integrated in a common measuring unit.

25. The apparatus of claim 19, wherein the time calculating circuit and the circuit are integrated in a common measuring unit.

26. The apparatus of claim 20, wherein the time calculating circuit and the circuit are integrated in a common measuring unit.

27. The apparatus of claim 18, wherein the time calculating circuit and the circuit are included in a hand-held device.

28. The apparatus of claim 19, wherein the time calculating circuit and the circuit are included in a hand-held device.

29. The apparatus of claim 20, wherein the time calculating circuit and the circuit are included in a hand-held device.

30. The apparatus of claim 18, wherein the time calculating circuit for calculating the rise time of the output signal uses the formula:

$$t_{RISE} = T_{output}[(Vr_1 - Vr_2)/(V_{HIGH} - V_{LOW})];$$

where $T_{output}$ is the period of the output wave, $Vr_1$ is one of the at least two rise time signals, $Vr_2$ is the other of the at least two rise time signals, $V_{HIGH}$ is the maximum voltage of the output waveform, and $V_{LOW}$ is the minimum voltage of the output waveform.

31. The apparatus of claim 19, wherein the time calculating circuit for calculating the fall time of the output signal uses the formula:

$$t_{FALL} = T_{output}[(Vf_1 - Vf_2)/(V_{HIGH} - V_{LOW})];$$

where $T_{output}$ is the period of the output wave, $Vf_1$ is one of the at least two fall time signals, $Vf_2$ is the other of the at least two fall time signals, $V_{HIGH}$ is the maximum voltage of the output waveform, and $V_{LOW}$ is the minimum voltage of the output waveform.

32. The apparatus of claim 20, wherein the time calculating circuit for calculating the rise and fall times of the output signal uses the formulas:

$$t_{RISE} = T_{output}[(Vr_1 - Vr_2)/(V_{HIGH} - V_{LOW})];$$

where $T_{output}$ is the period of the output wave, $Vr_1$ is one of the at least two rise time signals, $Vr_2$ is the other of the at least two rise time signals, $V_{HIGH}$ is the maximum voltage of the output waveform, and $V_{LOW}$ is the minimum voltage of the output waveform; and, $$t_{FALL} = T_{output}[(Vf_1 - Vf_2)/(V_{HIGH} - V_{LOW})];$$

where $T_{output}$ is the period of the output wave, $Vf_1$ is one of the at least two fall time signals, $Vf_2$ is the other of the at least two fall time signals, $V_{HIGH}$ is the maximum voltage of the output waveform, and $V_{LOW}$ is the minimum voltage of the output waveform.

33. The apparatus of claim 1, wherein the signal generating circuit comprises:
a clock for applying a clock signal to said first signal path for driving said switching device.

34. The apparatus of claim 33, wherein the signal generating circuit comprises:
at least one flip-flop connected to said clock for supplying said circuit with at least one gating signal.

35. The apparatus of claim 33, wherein the signal generating circuit further comprises:
at least one flip-flop connected to said clock for providing said switching signal to said first signal path.

36. The apparatus of claim 34, wherein the signal generating circuit further comprises:
at least one inverter connected between said at least one flip-flop and said clock.

37. The apparatus of claim 1, wherein said two points are chosen to be an equal percentage from a maximum and a minimum voltage level of the output signal.

38. The apparatus of claim 37, wherein said two points are chosen to be 10% and 90% of the maximum voltage level of the output signal.

39. A method for determining the rise and fall time of a tested device comprising the steps of:
sending a test signal to the input of the device, said test signal causing the device to switch between a first state and a second state;
receiving an output signal at the output of the device;
calculating the rise and fall time of the device by measuring the output signal at two or more points on a portion of said output signal representing a transition of said device from said first state to said second state.

40. The method of claim 39, further comprising the step of:
comparing the output signal to at least one threshold voltage to obtain at least one compared wave, before calculating the rise and fall time of the device.

41. The method of claim 40, wherein said at least one threshold voltage is equal to ten percent of the maximum voltage of the output signal.

42. The method of claim 40, wherein said at least one threshold voltage is equal to ninety percent of the maximum voltage of the output signal.

43. The method of claim 40, further comprising the step of:
dividing the at least one compared wave into at least two separate waves, before calculating the rise and fall time of the device.

44. The method of claim 43, further comprising the step of:
transmitting one of the at least two separate waves to at least one digital logic circuit.

45. The method of claim 44, further comprising the step of:
comparing said one of the at least two separate waves to a clock signal in said digital logic circuit to obtain at least one rise time signal.

46. The method of claim 44, further comprising the step of:
comparing said one of the at least two separate waves to a clock signal in said digital logic circuit to obtain at least one fall time signal.

47. The method of claim 43, further comprising the steps of:
transmitting one of the at least two separate waves to a first digital logic circuit; and,
transmitting the other of the at least two separate waves to a second digital logic circuit.

48. The method of claim 47, further comprising the steps of:
comparing said one of the at least two separate waves to a first clock signal in said first digital logic circuit to obtain at least one rise time signal; and,
comparing said other of the at least two separate waves to a second clock signal in said second digital logic circuit to obtain at least one fall time signal.

49. The method of claim 48, further comprising the steps of:
measuring the area under the rise and fall time signals to determine the rise and fall time of the device.

50. The method of claim 45, further comprising the step of:
measuring the area under the at least one rise time signal to determine the rise time of the device.

51. The method of claim 46, further comprising the step of:
measuring the area under the at least one fall time signal to determine the fall time of the device.

52. The method of claim 49, wherein the rise and fall time signals are integrated in order to determine the rise and fall time of the device.

53. The method of claim 49, wherein an error introduced at the three comparing steps is canceled.

54. The method of claim 53, wherein an error rise time and an error fall time associated with each comparing step is constant so that when measuring the area under the rise and fall time signals the error rise and fall times cancel each other out.

55. An integrated circuit comprising:
a first signal path for connection to an output of a switching device;
a circuit connected to said first signal path for receiving an output signal from said switching device, a dc threshold voltage, and at least one delayed reference signal,
said circuit providing a dc output voltage proportional to the time difference between the time at which the at least one delayed reference signal switches from a first state to a second state and the time at which an output signal from said switching device crosses the dc threshold voltage;
said dc voltage output measured for at least two different dc threshold voltages, and wherein a switching device transition time is proportional to the difference in the dc voltage output for said at least two different dc threshold voltages.

56. The integrated circuit of claim 55, further comprising:
a periodic signal generator for providing a switching signal on a second signal path connected to the input of the switching device, said switching signal being capable of causing said switching device to switch from a first state to a second state.

57. The integrated circuit of claim 56, wherein the periodic signal generator further provides said at least one delayed reference signal to said circuit.

58. The integrated circuit of claim 55, wherein the circuit provides a representation of the rise time of the integrated circuit.

59. The integrated circuit of claim 55, wherein the circuit provides a representation of the fall time of the integrated circuit.

60. The integrated circuit of claim 55, wherein the circuit provides a representation of the rise and fall time of the integrated circuit.

61. The integrated circuit of claim 55, wherein a threshold voltage of the comparator is varied to produce at least two rise time and at least two fall time signals.

62. An apparatus for determining a switching transition time of an integrated circuit, said apparatus comprising:

a first signal path for connection to an input of a integrated circuit;

a second signal path for connection to an output of said integrated circuit;

a signal generator for providing a switching signal to said first signal path, said switching signal being capable of causing said integrated circuit to switch from a first state to a second state;

a circuit connected to said second signal path for receiving an output signal from said integrated circuit when it switches from said first state to said second state in response to said switching signal, said circuit measuring the voltage at two points on a portion of said output signal representing a transition of said integrated circuit from said first state to said second state, and providing therefrom a representation of a time of transition of said integrated circuit from said first state to said second state.

63. The apparatus of claim 62, wherein the circuit provides a representation of the rise time of the integrated circuit.

64. The apparatus of claim 62, wherein the circuit provides a representation of the fall time of the integrated circuit.

65. The apparatus of claim 62, wherein the circuit provides a representation of the rise and fall time of the integrated circuit.

66. The apparatus of claim 62, wherein the circuit comprises a comparator for collecting voltage samples from said two points.

67. The apparatus of claim 66, wherein a threshold voltage of the comparator is varied to produce at least two rise time and at least two fall time signals.

68. An integrated circuit comprising:

a comparing circuit for receiving a signal on an input line of the integrated circuit when a switching device connected to said input line switches from a first state to a second state, said circuit comparing the voltage at two or more points on a portion of said output signal representing a transition of said switching device from said first state to said second state, and providing therefrom a representation of a time of transition of said switching device from said first state to said second state.

69. The integrated circuit of claim 68, further comprising:

a signal generator for providing a switching signal to the input of said switching device, said switching signal being capable of causing a switching device to switch from said first state to said second state.

* * * * *